(12) United States Patent
Sueoka et al.

(10) Patent No.: US 10,811,584 B2
(45) Date of Patent: Oct. 20, 2020

(54) SEMICONDUCTOR CRYSTAL AND POWER GENERATION METHOD

(71) Applicant: Mitsubishi Gas Chemical Company, Inc., Tokyo (JP)

(72) Inventors: Shoichiro Sueoka, Tokyo (JP); Tetsuhiko Mizusaka, Tokyo (JP); Shinji Munetoh, Fukuoka (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 16/478,752

(22) PCT Filed: Jan. 16, 2018

(86) PCT No.: PCT/JP2018/001015
§ 371 (c)(1),
(2) Date: Jul. 17, 2019

(87) PCT Pub. No.: WO2018/135486
PCT Pub. Date: Jul. 26, 2018

(65) Prior Publication Data
US 2019/0341539 A1 Nov. 7, 2019

(30) Foreign Application Priority Data
Jan. 19, 2017 (JP) .................. 2017-007728

(51) Int. Cl.
*H01L 35/14* (2006.01)
*H01L 35/30* (2006.01)
(Continued)

(52) U.S. Cl.
CPC .............. *H01L 35/14* (2013.01); *H01L 35/30* (2013.01); *H01L 35/34* (2013.01); *C01B 33/06* (2013.01)

(58) Field of Classification Search
CPC .......... H01L 35/26; H01L 35/34; H01L 35/30; H01L 35/22; H01L 35/14; H01L 31/10; C01B 33/06
See application file for complete search history.

(56) References Cited

U.S. PATENT DOCUMENTS

| | | | | |
|---|---|---|---|---|
| 6,103,403 A | * | 8/2000 | Grigorian | ............... C01B 33/06 428/641 |
| 6,169,245 B1 | * | 1/2001 | Sharp | ..................... H01L 35/16 136/203 |

(Continued)

FOREIGN PATENT DOCUMENTS

| | | | | |
|---|---|---|---|---|
| EP | 2562835 A1 | * | 2/2013 | ............. H01L 35/20 |
| GB | 2228823 A | | 5/1990 | |

(Continued)

OTHER PUBLICATIONS

WO 2015/125823 A1 online machine translation, translated on Jul. 6, 2020.*

(Continued)

*Primary Examiner* — Golam Mowla
(74) *Attorney, Agent, or Firm* — Greenblum & Bernstein, P.L.C.

(57) ABSTRACT

A semiconductor crystal containing a clathrate compound represented by the following formula (I), the semiconductor crystal having one end portion and the other end portion, wherein the one and the other end portions differ in concentration of at least one element in the formula (I):

$$A_xD_yE_{46-y} \qquad (I)$$

wherein A represents at least one element selected from the group consisting of Ba, Na, Sr, and K, D represents at least one element selected from the group consisting of B, Ga, and In, E represents at least one element selected from the group (Continued)

consisting of Si, Ge, and Sn, x is 7 or more and 8 or less, and y is 14 or more and 20 or less.

20 Claims, 4 Drawing Sheets

(51) Int. Cl.
*H01L 35/34* (2006.01)
*C01B 33/06* (2006.01)

(56) References Cited

U.S. PATENT DOCUMENTS

| | | | |
|---|---|---|---|
| 6,188,011 B1 | 2/2001 | Nolas et al. | |
| 6,423,286 B1* | 7/2002 | Gryko | C01B 33/06 136/236.1 |
| 6,461,581 B1* | 10/2002 | Eguchi | C01B 33/06 423/1 |
| 6,797,199 B2* | 9/2004 | Eguchi | C01B 33/06 136/236.1 |
| 8,097,802 B2* | 1/2012 | Yang | H01L 35/22 136/236.1 |
| 2003/0197156 A1* | 10/2003 | Eguchi | C01B 33/06 252/500 |
| 2008/0190475 A1* | 8/2008 | Kita | C22C 28/00 136/239 |
| 2008/0216884 A1* | 9/2008 | Shibata | H01L 35/22 136/239 |
| 2009/0291297 A1* | 11/2009 | Prokofiev | B22F 9/08 428/336 |
| 2010/0275963 A1* | 11/2010 | Yang | H01L 35/22 136/236.1 |
| 2011/0218109 A1* | 9/2011 | Bai | C22C 19/00 505/124 |

FOREIGN PATENT DOCUMENTS

| | | | |
|---|---|---|---|
| JP | 2007-51345 | 3/2007 | |
| JP | 2007-103580 | 4/2007 | |
| JP | 2015-38984 | 2/2015 | |
| JP | 2015/039161 | 3/2018 | |
| WO | WO-2006095839 A1 * | 9/2006 | C22C 1/0491 |
| WO | 2015/125823 | 8/2015 | |

OTHER PUBLICATIONS

Yamasoto et al., "*A Novel Electric Power Generation Mechanism from Waste Heat without Temperature Gradient*", MRS Advances, Jan. 1, 2016, pp. 3941-3946.

Suekuni et al, "*Simultaneous Structure and Carrier Tuning of Dimorphic Clathrate $Ba_8Ga_{16}Sn_{30}$*", Physical Review B, Jun. 2008, p. 75.

Norihiko L. Okamoto et al., "Crystal structure and thermoelectric properties of type-I clathrate compounds in the Ba—Ga—Ge system", Journal of Applied Physics, 100, Oct. 3, 2006, pp. 073504-1-073504-10.

Official Communication issued in International Application No. PCT/JP2018/001015, dated Mar. 20, 2018.

\* cited by examiner

SEMICONDUCTOR CRYSTAL AND POWER GENERATION METHOD

TECHNICAL FIELD

The present invention relates to a semiconductor crystal and a power generation method using the semiconductor crystal.

BACKGROUND ART

Thermoelectric conversion elements exploiting the Seebeck effect enable conversion of thermal energy into electrical energy. Making use of this property allows exhaust heat from industrial processes or moving bodies to be converted into useful electrical power. Therefore, various thermoelectric conversion elements exploiting the Seebeck effect have been studied.

In general, thermoelectric conversion elements exploiting the Seebeck effect convert thermal energy into electrical energy using electromotive force derived from temperature difference. Various techniques for improving the performance of thermoelectric materials that exhibit the Seebeck effect based on temperature difference have been investigated. However, when a power generation module is assembled using a thermoelectric material exploiting electromotive force derived from temperature difference, the temperature difference may, due to heat conduction or any other cause, become so small that the amount of power generation is reduced. Prevention of such reduction in the amount of power generation requires a device maintaining sufficient temperature difference such as a cooler, thus resulting in complication of the module.

Extremely few studies have been conducted to obtain a material that functions as a thermoelectric conversion element even without temperature difference. For example, a semiconductor single crystal as described in Patent Document 1 has been proposed.

CITATION LIST

Patent Document

Patent Document 1: International Publication No. WO 2015/125823

SUMMARY OF INVENTION

Technical Problem

In the case of the semiconductor single crystal described in Patent Document 1, however, there is a limit to the composition of clathrate compounds capable of power generation, and the electromotive force is small.

The present invention has been made in view of the above circumstances, and an object of the present invention is to provide a novel semiconductor crystal capable of functioning as a thermoelectric conversion element (hereinafter simply referred to as "thermoelectric element") even without temperature difference and a power generation method using the semiconductor crystal.

Solution to Problem

As a result of intensive investigations aimed at achieving the above object, the present inventors have found that a novel semiconductor crystal containing a clathrate compound having a predetermined composition can function as a thermoelectric conversion element even without temperature difference and have completed the present invention.

That is, the present invention is as follows.

[1] A semiconductor crystal comprising a clathrate compound represented by the following formula (I), the semiconductor crystal having one end portion and the other end portion, wherein the one and the other end portions differ in concentration of at least one element in the formula (I):

$$A_x D_y E_{46-y} \quad (I)$$

wherein A represents at least one element selected from the group consisting of Ba, Na, Sr, and K, D represents at least one element selected from the group consisting of B, Ga, and In, E represents at least one element selected from the group consisting of Si, Ge, and Sn, x is 7 or more and 8 or less, and y is 14 or more and 20 or less.

[2] The semiconductor crystal according to [1], wherein the one end portion is a p-type semiconductor portion, the other end portion is an n-type semiconductor portion, and the p-type semiconductor portion and the n-type semiconductor portion are joined to each other.

[3] The semiconductor crystal according to [1] or [2], wherein the clathrate compound comprises a compound represented by the following formula (II):

$$A_x D_y E^1{}_{46-y-z} Si_z \quad (II)$$

wherein A represents at least one element selected from the group consisting of Ba, Na, Sr, and K, D represents at least one element selected from the group consisting of B, Ga, and In, $E^1$ represents at least one element selected from the group consisting of Ge and Sn, x is 7 or more and 8 or less, y is 14 or more and 20 or less, and z is 0 or more and 23 or less.

[4] The semiconductor crystal according to [1], wherein the one end portion is a p-type semiconductor portion comprising a clathrate compound represented by the following formula (III), and the other end portion is an n-type semiconductor portion comprising a clathrate compound represented by the following formula (IV):

$$A_x D_y E^2{}_{46-y-z1} Si_{z1} \quad (III)$$

wherein A represents at least one element selected from the group consisting of Ba, Na, Sr, and K, D represents at least one element selected from the group consisting of B, Ga, and In, $E^2$ represents at least one element selected from the group consisting of Ge and Sn, x is 7 or more and 8 or less, y is 14 or more and 20 or less, and z1 is 0 or more and less than 4, $$A_x D_y E^1{}_{46-y-z2} Si_{z2} \quad (IV)$$

wherein A represents at least one element selected from the group consisting of Ba, Na, Sr, and K, D represents at least one element selected from the group consisting of B, Ga, and In, $E^1$ represents at least one element selected from the group consisting of Ge and Sn, x is 7 or more and 8 or less, y is 14 or more and 20 or less, and z2 is 3 or more and 23 or less, provided that z2 is greater than z1 in the formula (III).

[5] The semiconductor crystal according to any one of [1] to [4], wherein a difference between the number y in the one end portion and the number y in the other end portion is 0.01 or more and 4.0 or less.

[6] The semiconductor crystal according to any one of [1] to [5], wherein A is Ba in the formula (I).

[7] The semiconductor crystal according to any one of [1] to [6], wherein D is Ga in the formula (I).

[8] The semiconductor crystal according to any one of [1] to [7], wherein E is at least one element selected from the group consisting of Ge and Si in the formula (I).

[9] The semiconductor crystal according to any one of [1] to [8], wherein the semiconductor crystal is a single crystal or a polycrystal.

[10] The semiconductor crystal according to any one of [1] to [9], comprising a clathrate compound represented by the following formula (V):

$$Ba_xD_yGe_{46-y-z}Si_z \quad (V)$$

wherein D represents at least one element selected from the group consisting of B, Ga, and In, x is 7 or more and 8 or less, y is 14 or more and 20 or less, and z is 0 or more and 23 or less.

[11] The semiconductor crystal according to any one of [1] to [10], comprising a clathrate compound represented by the following formula (VI):

$$Ba_xGa_yGe_{46-y-z}Si_z \quad (VI)$$

wherein x is 7 or more and 8 or less, y is 14 or more and 20 or less, and z is 0 or more and 23 or less.

[12] A power generation method generating electrical power by heating the semiconductor crystal according to any one of [1] to [11].

[13] An infrared detector comprising the semiconductor crystal according to any one of [1] to [11].

Advantageous Effects of Invention

The present invention can provide a novel semiconductor crystal capable of functioning as a thermoelectric element even without temperature difference between constituent portions of the crystal, and a power generation method using the semiconductor crystal; even by the use of clathrate compounds with a wide variety of compositions.

DESCRIPTION OF EMBODIMENTS

Hereinafter, an embodiment of the present invention (hereinafter, referred to as the "present embodiment") will be described in detail by referring to the drawings as necessary. However, the present invention is not limited to the present embodiment described below, and various changes or modifications can be made to the present invention without departing from the spirit of the invention. The same components are designated by the same reference signs in the drawings, and redundant explanation of the same components will be omitted. The positional relationships such as vertical and horizontal directions correspond to the positional relationships shown in the drawings, unless explicitly stated otherwise. The dimensional proportions are not limited to those shown in the drawings. The semiconductor crystal in the present embodiment is a semiconductor crystal containing a clathrate compound represented by the following formula (I), the semiconductor crystal having one end portion and the other end portion opposite to the one end portion, wherein the one and the other end portions differ in concentration of at least one element in the formula (I).

$$A_xD_yE_{46-y} \quad (I)$$

In the formula (I), A represents at least one element selected from the group consisting of Ba, Na, Sr, and K, D represents at least one element selected from the group consisting of B, Ga, and In, and E represents at least one element selected from the group consisting of Si, Ge, and Sn. x is 7 or more and 8 or less, and y is 14 or more and 20 or less. A difference between the number y in the one end portion and the number y in the other end portion is preferably 0.01 or more, more preferably 0.02 or more, and even more preferably 0.1 or more, in order to achieve the effect of the present invention more effectively and reliably. Likewise, in order to achieve the effect of the present invention more effectively and reliably, the difference between the numbers y is preferably 4.0 or less, more preferably 2.0 or less, and even more preferably 1.0 or less. The difference between the numbers y is preferably 0.01 or more and 4.0 or less, more preferably 0.02 or more and 2.0 or less, and even more preferably 0.1 or more and 1.0 or less.

Figure 1:
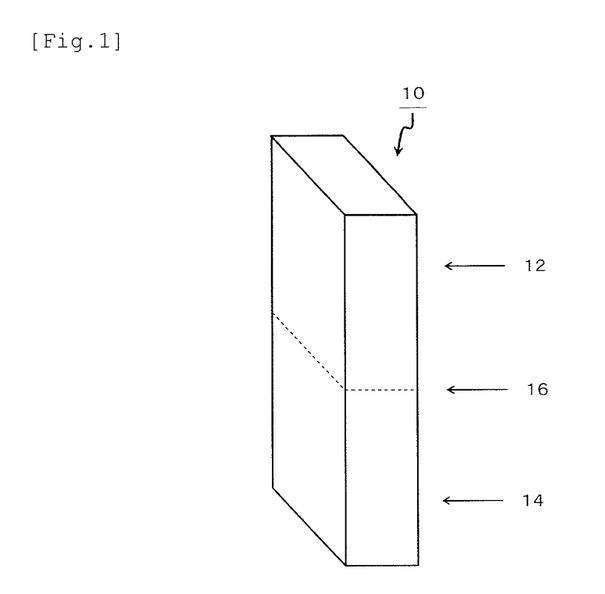
FIG. 1 is a perspective view schematically showing the configuration of an exemplary semiconductor crystal according to an embodiment of the present invention.

FIG. 1 schematically shows the configuration of an exemplary semiconductor crystal in the present embodiment. The shape of the semiconductor crystal is not particularly limited, and the semiconductor crystal may be in the shape of a plate, a cuboid or a column shape such as a cylinder. As shown in FIG. 1, when a semiconductor crystal 10 is in the shape of a plate or column shape, the semiconductor crystal 10 will have a p-type semiconductor portion 14 in the lower portion (one end portion) and an n-type semiconductor portion 12 in the upper portion (the other end portion). In the semiconductor crystal 10, the n-type semiconductor portion 12 and the p-type semiconductor portion 14 are directly joined, and a p-n junction 16 is formed.

In such a semiconductor crystal 10, the n-type semiconductor portion 12 and the p-type semiconductor portion 14 differ in concentration of at least one element. This difference in elemental concentration is considered to contribute to such a band gap distribution of the semiconductor crystal 10 as described below, and consequently enable power generation without temperature difference. The possible reason for this includes, but not limited to, the following. That is, it is inferred that a region having a smaller band gap than the n-type semiconductor portion 12 and p-type semiconductor portion 14 lies in, for example, a joining portion between the n-type semiconductor portion 12 and the p-type semiconductor portion 14 (p-n junction 16). Heating such a semiconductor crystal 10 to a predetermined temperature causes electrons in the valence band to be thermally excited to the conduction band. This thermal excitation of the electrons to the conduction band occurs only at the p-n junction 16 where the band gap is relatively small. In the n-type semiconductor portion 12 and p-type semiconductor portion 14 where the band gap is relatively large, thermal excitation of electrons is less likely to occur. After being thermally exited to the conduction band, the electrons excited at the p-n junction 16 move to a lower-energy side, i.e., to the n-type semiconductor portion 12. Meanwhile, the holes generated in the valence band as a result of the excitation of the electrons move to the p-type semiconductor portion 14 having a lower energy. Consequently, the n-type semiconductor portion 12 is negatively charged, while the p-type semiconductor portion 14 is positively charged, so that an electromotive force is generated. This is a possible explanation for the ability of the semiconductor crystal 10 to generate electrical power even without temperature difference between the n-type semiconductor portion 12 and the p-type semiconductor portion 14. Such a mechanism of generating the electromotive force is different from the Seebeck effect in which the electromotive force is derived from temperature difference.

Since the semiconductor crystal 10 in the present embodiment is capable of power generation without temperature difference, the use of the semiconductor crystal 10 in a module can eliminate equipment for temperature control such as cooling or heating and simplify the module. The semiconductor crystal 10 can therefore be suitably used as a power generation material for thermoelectric conversion or exhaust heat recovery. For example, the semiconductor crystal 10 can be incorporated in a power generation module, and the power generation module can be installed, for example, in a transportation machine (such as an automobile or airplane), device, or plant having an internal combustion engine.

The semiconductor crystal 10 preferably contains a clathrate compound represented by the formula (I) and containing A, D, and E as constituent elements (A, D, and E described as elements will also be referred to as "element A", "element D", and "element E", respectively). In such a clathrate compound, the element A acts as a monovalent or divalent donor, and the element D acts as a trivalent or monovalent acceptor. For the semiconductor crystal 10, the number y, which represents a molar ratio of the element D in the clathrate compound, preferably differs between the p-type semiconductor portion 14 and the n-type semiconductor portion 12. In other words, the p-type semiconductor portion 14 and the n-type semiconductor portion 12 preferably differ in the concentration of the element D. The number x, which represents a molar ratio of the element A, may be almost uniform in the semiconductor crystal 10 or may differ between the p-type semiconductor portion 14 and the n-type semiconductor portion 12. In the semiconductor crystal 10, the lower portion has a higher molar ratio of the element D to the element A (y/x) than the upper portion. Thus, the upper portion corresponds to the n-type semiconductor portion 12, and the lower portion corresponds to the p-type semiconductor portion 14.

The clathrate compound, which means inclusion compound, is constituted by a cage-like framework composed of the element D and the element E, and the element A included in the cage-like framework. A clathrate compound is known in which the cage-like framework consists solely of the element E ($Ba_8Si_{46}$, for example) as a common clathrate compound. However, production of such a clathrate compound requires extremely high pressure. By contrast, a clathrate compound having a structure with the element D substituting for the element E at the 6c site can be synthesized by arc melting at ordinary pressure.

In the formula (I), the element A is preferably Ba. The element D is preferably at least one element selected from the group consisting of B, Ga, and In and more preferably Ga. The element E is preferably at least one element selected from the group consisting of Ge and Si. Additionally, y is preferably 0 or more and 20 or less and more preferably 14 or more and 20 or less. With these features, the semiconductor crystal can exhibit the effect of the present invention more effectively and reliably.

The clathrate compound preferably contains a compound represented by the following formula (II) as the compound represented by the formula (I).

$$A_xD_yE^1_{46-y-z}Si_z \qquad (II)$$

In the formula (II), A represents at least one element selected from the group consisting of Ba, Na, Sr, and K, D represents at least one element selected from the group consisting of B, Ga, and In, and $E^1$ represents at least one element selected from the group consisting of Ge and Sn. x is 7 or more and 8 or less, y is 14 or more and 20 or less, and z is 0 or more and 23 or less. The element A is preferably Ba. The element D is preferably at least one element selected from the group consisting of B, Ga, and In, and $E^1$ is preferably Ge. y is preferably 14 or more and 18 or less, and z is preferably 0 or more and 15 or less. With these features, the semiconductor crystal can exhibit the effect of the present invention more effectively and reliably.

The clathrate compound more preferably contains a compound represented by the following formula (V) as the compound represented by the formula (I) and even more preferably contains a compound represented by the following formula (VI) as the compound represented by the formula (I).

$$Ba_xD_yGe_{46-y-z}Si_z \qquad (V)$$

$$Ba_xGa_yGe_{46-y-z}Si_z \qquad (VI)$$

In the formulae (V) and (VI), D represents at least one element selected from the group consisting of B, Ga, and In, and is preferably at least one element selected from the group consisting of B, Ga, and In. x is 7 or more and 8 or less, y is 14 or more and 20 or less, and z is 0 or more and 23 or less. y is preferably 14 or more and 18 or less, z is preferably 0 or more and 15 or less, and the lower limit of z may be 0. With these features, the semiconductor crystal can exhibit the effect of the present invention more effectively and reliably.

Preferably, in the semiconductor crystal in the present embodiment, the one end portion is a p-type semiconductor portion and the other end portion is an n-type semiconductor portion. In this case, z in the formula (I), (II), (V), or (VI) is greater in the n-type semiconductor portion than in the p-type semiconductor portion. Specifically, it is more preferable that the one end portion be a p-type semiconductor portion containing a clathrate compound represented by the following formula (III) and the other end portion be an n-type semiconductor portion containing a clathrate compound represented by the following formula (IV).

$$A_xD_yE^2_{46-y-z1}Si_{z1} \qquad (III)$$

In the formula (III), A represents at least one element selected from the group consisting of Ba, Na, Sr, and K and is preferably Ba, D represents at least one element selected from the group consisting of B, Ga, and In, and is preferably at least one element selected from the group consisting of B, Ga, and In and more preferably Ga, $E^2$ represents at least one element selected from the group consisting of Ge and Sn and is preferably Ge. x is 7 or more and 8 or less, y is 14 or more and 20 or less, and z1 is 0 or more and less than 4.

$$A_xD_yE^1_{46-y-z2}Si_{z2} \qquad (IV)$$

In the formula (IV), A represents at least one element selected from the group consisting of Ba, Na, Sr, and K and is preferably Ba, D represents at least one element selected from the group consisting of B, Ga, and In, and is preferably at least one element selected from the group consisting of B, Ga, and In, and more preferably Ga, $E^1$ represents at least one element selected from the group consisting of Ge and Sn and is preferably Ge. x is 7 or more and 8 or less, y is 14 or more and 20 or less, and z2 is 3 or more and 23 or less. It should be noted that the composition in the p-type semiconductor portion and the composition in the n-type semiconductor portion differ from each other, and z2 in the formula (IV) is greater than z1 in the formula (III). With these features, the semiconductor crystal can exhibit the effect of the present invention more effectively and reliably.

Specific examples of clathrate compounds acting as n-type semiconductors include $Ba_xGa_yGe_{46-y-z}Si_z$, $Ba_xGa_ySn_{46-y-z}Si_z$, $Ba_xGa_ySi_{46-y-z}Sn_z$, $Ba_xGa_yGe_{46-y-z}Sn_z$, and $Ba_xGa_ySi_{46-y-z}Ge_z$. It should be noted that x is 7 or more and 8 or less, y is 14 or more and 20 or less, and z is 3 or more and 23 or less. Specific examples of clathrate compounds acting as p-type semiconductors include $Ba_xGa_yGe_{46-y-z}Si_z$, $Ba_xGa_ySn_{46-y-z}Si_z$, $Ba_xGa_ySi_{46-y-z}Sn_z$, $Ba_xGa_yGe_{46-y-z}Sn_z$, and $Ba_xGa_ySi_{46-y-z}Ge_z$. It should be noted that x is 7 or more and 8 or less, y is 14 or more and 20 or less, and z is 0 or more and less than 4.

The semiconductor crystal 10 has a p-n junction 16 formed as a result of joining the n-type semiconductor portion 12 and p-type semiconductor portion 14. The n-type semiconductor portion 12 and the p-type semiconductor portion 14 differ in concentration of at least one element. Having such a structure, the semiconductor crystal 10 in the present embodiment can generate electrical power in a given temperature range even without temperature difference between the p-type semiconductor portion 14 and n-type semiconductor portion 12.

The semiconductor crystal 10 may be a polycrystal or a single crystal. In order to easily obtain the semiconductor crystal 10 in a desired form, the semiconductor crystal 10 is preferably a polycrystal. In order to obtain a crystal with high electrical conductivity, the semiconductor crystal 10 is preferably a single crystal.

A power generation method in the present embodiment is a method generating electrical power using a power generation module including the semiconductor crystal 10 and a pair of electrodes connected respectively to the n-type semiconductor portion 12 and the p-type semiconductor portion 14. Components used in the power generation module other than the semiconductor crystal 10 can be known ones. The semiconductor crystal 10 can efficiently generate electrical power when heated, for example, to 50 to 700° C., preferably to 200 to 500° C. In the semiconductor crystal 10, the absolute value of the potential difference between the two end portions at 500° C. can be 0.5 mV or more or even 0.5 to 20 mV (0.5 to 4 mV, for example).

An exemplary method for producing the semiconductor crystal 10 in the present embodiment is as follows. First, metals or semimetals corresponding to the constituent elements of the clathrate compound are prepared. The prepared metals or semimetals are weighed in predetermined proportions depending on the composition of the desired end product. The prepared metals or semimetals are weighed in a glove box which may be purged with argon gas if necessary. The weighed metals and semimetals are placed in a copper mold and melted by a technique such as arc melting. The temperature of the molten metal during the arc melting is, for example, about 2000° C. to 3000° C.

The molten liquid obtained by the arc melting is cooled to obtain an ingot of a clathrate compound represented by the formula (I). The obtained ingot is crushed to obtain a powdery clathrate compound.

Additionally, another powdery clathrate compound is obtained in the same manner as above, except that the composition is adjusted to allow the other powdery clathrate compound to differ in concentration of at least one element from the above clathrate compound.

Next, the two powdery clathrate compounds differing in concentration of at least one element are charged into a graphite die shaped to yield a formed body of desired shape, with the two compounds being arranged separately in lower and upper layers. Next, the graphite die charged with the compounds is placed at a predetermined location in a chamber of a spark plasma sintering apparatus, and the interior of the chamber is set to high vacuum. Next, the interior of the graphite die is heated, for example, to 700 to 900° C. while being pressurized, for example, to 40 to 60 MPa. These conditions are maintained, for example, for 2 to 10 minutes to sinter the clathrate compounds in the graphite die. In this manner, a semiconductor having two clathrate compounds joined to each other is obtained.

Subsequently, the semiconductor is placed in a vacuum oven and heated, for example, to 700 to 1100° C. under high vacuum, thus annealing the semiconductor, for example, for 5 to 14 hours to obtain a semiconductor polycrystal.

Figure 2:
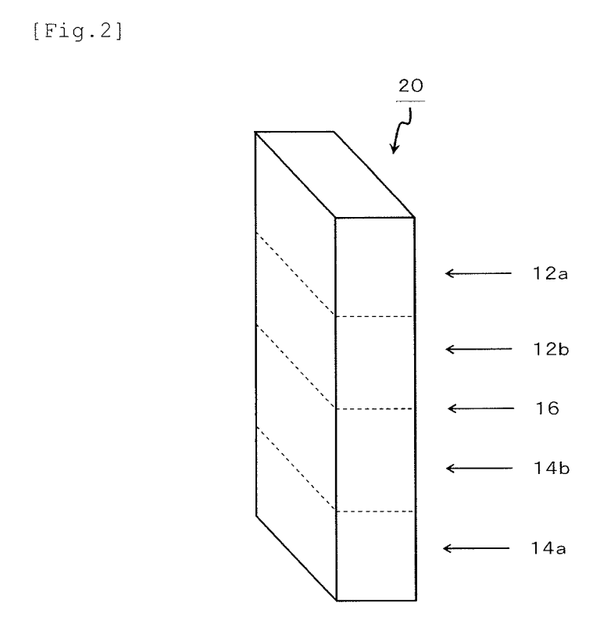
FIG. 2 is a perspective view schematically showing the configuration of another exemplary semiconductor crystal according to an embodiment of the present invention.

FIG. 2 schematically shows the configuration of another example of the semiconductor crystal in the present embodiment. A semiconductor crystal 20 has p-type semiconductor portions 14a and 14b in the lower portion (one end portion) and n-type semiconductor portions 12a and 12b in the upper portion (the other end portion). The p-type semiconductor portions 14a and 14b may be any p-type semiconductor portions containing clathrate compounds as described above which function as p-type semiconductors, provided that the compounds in the portions 14a and 14b have different compositions. The n-type semiconductor portions 12a and 12b may be any n-type semiconductor portions containing clathrate compounds as described above which function as n-type semiconductors, provided that the compounds in the portions 12a and 12b have different compositions. In the semiconductor crystal 20 in this example, the n-type semiconductor portion 12b and the p-type semiconductor portion 14b are directly joined to form a p-n junction 16. Thus, the semiconductor crystal in the present embodiment may contain two or more p-type semiconductor portions and may contain two or more n-type semiconductor portions. Such a semiconductor crystal 20 can, for the same reason as described above, generate electrical power even without temperature difference between the n-type semiconductor portions 12a and 12b and the p-type semiconductor portions 14a and 14b.

Figure 3:
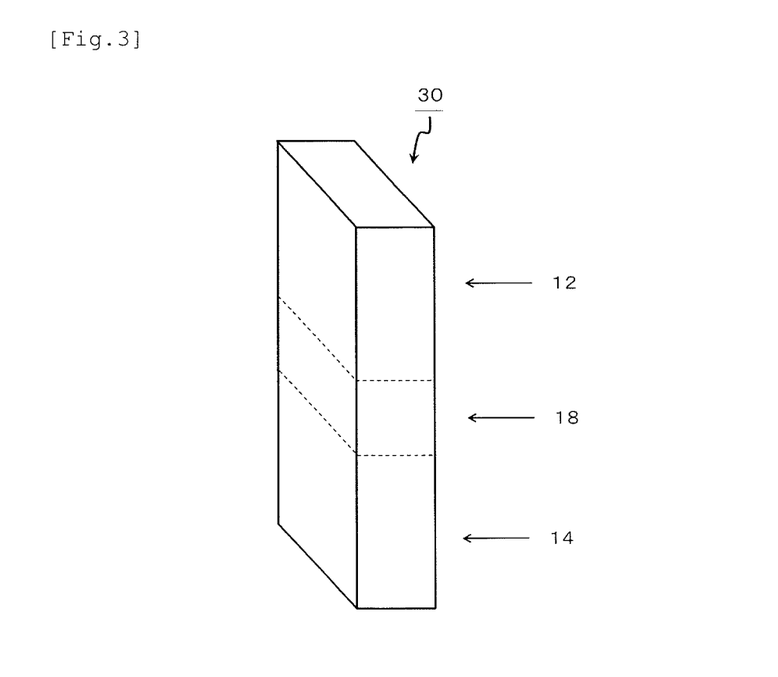
FIG. 3 is a perspective view schematically showing the configuration of still another exemplary semiconductor crystal according to an embodiment of the present invention.

FIG. 3 schematically shows the configuration of another example of the semiconductor crystal in the present embodiment. A semiconductor crystal 30 has a p-type semiconductor portion 14 in the lower portion (one end portion), an n-type semiconductor portion 12 in the upper portion (the other end portion), and an intrinsic semiconductor portion 18 between the portions 14 and 12. In such a semiconductor crystal 30, z in the formulae (I), (II), (V), (VI), (III), and (IV), z1 in the formula (III), and z2 in the formula (IV) are the largest in the n-type semiconductor portion 12, the second largest in the intrinsic semiconductor portion 18, and the smallest in the p-type semiconductor portion 14. A specific example of the clathrate compound serving as the intrinsic semiconductor in the intrinsic semiconductor portion 18 is $B_xGa_yGe_{46-y-z}Si_z$. It should be noted that x is 7 or more and 8 or less, y is 14 or more and 20 or less, and z is 3 to 4.

The semiconductor crystal in the present embodiment is particularly suitable as a thermoelectric element, and an infrared detector and infrared imaging device containing the semiconductor crystal are also included in the present embodiment. The type and configuration of an infrared detector and infrared imaging device in the present embodiment are not limited to specific ones as long as the detector and device contain the semiconductor crystal. Other than the semiconductor crystal, the components of the detector and device may be known ones as long as the detector and device contain the semiconductor crystal as a base substrate and/or crystal layer. Examples of such an infrared detector and infrared imaging device include an intrinsic semiconductor-type infrared detector, an extrinsic semiconductor-type infrared detector, an internal photoelectric effect-type infrared detector, a bolometer, a quantum well-type infrared detector (QWIP), and a quantum dot-type infrared detector (QDIP) which contain the semiconductor crystal of the present embodiment.

Although the foregoing has described the present embodiment, the present invention is not limited to the present embodiment described above. For example, although in the present embodiment described above a plate-shaped semiconductor crystal is illustrated, the semiconductor crystal of the present invention is not limited to a plate shape and may be formed in any of various shapes depending on the application. The method for producing the semiconductor crystal is not limited to that described above, and various methods for producing polycrystals and single crystals can be employed. For example, when the semiconductor crystal in the present invention is a polycrystal, the semiconductor crystal can be produced by casting. When the semiconductor crystal in the present invention is a single crystal, the semiconductor crystal may be produced by a method in which one of two different single crystals is implanted, for example, with ions acting as a dopant, and then the single crystals are subjected to annealing in a manner as previously described. Further, when the semiconductor crystal in the present invention is a single crystal, the semiconductor crystal may be produced by a method in which two or more different single crystals are implanted, for example, with ions acting as a dopant, and then the single crystals are subjected to annealing in a manner as previously described. Alternatively, the semiconductor crystal in the present embodiment may be produced by a FZ method (floating zone method) in which two polycrystal samples differing in concentration of a certain element are prepared, each sample is melted by irradiation with laser light, and then the molten liquid is slowly cooled to grow a single crystal. Alternatively, the semiconductor crystal in the present embodiment may be produced by using a Czochralski method instead of the FZ method.

According to the present invention, as described above, a thermoelectric element capable of generating electrical power by heating without temperature difference created between constituent portions of the thermoelectric element can be provided even by the use of clathrate compounds with a wide variety of compositions.

EXAMPLES

Hereinafter, the present invention will be described in more detail by examples. The present invention is not limited to these examples.

Example 1

<Preparation of Clathrate Compounds by Arc Melting>

Commercially-available Ba, Ga, Ge, and Si powders (all of which are high-purity products) were prepared. These powders were weighed to give a ratio Ba:Ga:Ge:Si of 8:18:20:8 (molar ratio). The weighed powders were placed in a Cu mold, which was set in a chamber. The interior of the chamber was purged with argon gas, and then arc melting was carried out in which the powders in the Cu mold were melted by heating to about 2000° C. The obtained molten liquid was subsequently cooled. In this manner, an ingot of a clathrate compound ($Ba_8Ga_{18}Ge_{20}Si_8$) was obtained. Likewise, powders as raw materials were weighed to give a ratio Ba:Ga:Ge of 8:18:28 (molar ratio), and then an ingot of a clathrate compound ($Ba_8Ga_{18}Ge_{28}$) was obtained in the same manner as above.

<Production of Junction Semiconductor by Spark Plasma Sintering>

The obtained two ingots of clathrate compounds were respectively crushed into a powder. The two powders were charged into a graphite die shaped to yield a circular cylindrical body, with the powders being arranged separately in lower and upper layers. The graphite die charged with the powders was placed at a predetermined location in a chamber of a spark plasma sintering apparatus, and the interior of the chamber was set to high vacuum (2 Pa). Next, the interior of the graphite die was heated to 750° C. while being pressurized to 50 MPa, and these conditions were maintained for 5 minutes to sinter the clathrate compounds in the graphite die. Thus, a circular cylindrical semiconductor (diameter: 20 mm, height: 20 mm) with the two clathrate compounds joined together was obtained.

<Annealing>

Next, the obtained semiconductor was placed in a vacuum oven and heated to 900° C. under high vacuum ($10^{-3}$ to $10^{-2}$ Pa), thus annealing the semiconductor for 10 hours. As a result, a semiconductor polycrystal was obtained.

<Evaluation of Semiconductor Polycrystal>

Figure 4:
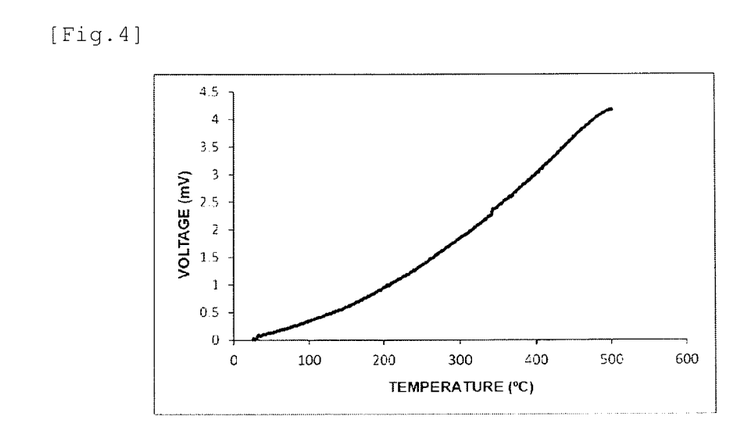
FIG. 4 is a chart showing dependence of voltage on temperature of a semiconductor crystal according to an example of the present invention.

Wires were connected to the two opposite end portions of the semiconductor polycrystal which were made of the different clathrate compounds to each other. The semiconductor polycrystal was heated, and the potential difference between the opposite end portions was measured. In this measurement, the semiconductor polycrystal was heated with an adjustment for preventing the occurrence of any temperature difference between the opposite end portions. The measured dependence of voltage on temperature of the semiconductor polycrystal is shown in FIG. 4. As seen from FIG. 4, it was observed that by heating to a temperature equal to or higher than a given temperature, a potential difference occurred between the opposite end portions of the semiconductor polycrystal despite no temperature difference between the opposite end portions.

The semiconductor polycrystal was cut in the vertical direction, with the semiconductor polycrystal being positioned so that, of the two end portions made of the clathrate compounds with different compositions, the end portion generally having the composition $Ba_8Ga_{18}Ge_{28}$ was located as a lower layer while the other end portion generally having the composition $Ba_8Ga_{18}Ge_{20}Si_8$ was located as an upper layer. The cut surface was subjected to elemental analysis using an electron probe microanalyzer (manufactured by Shimadzu Corporation under the product name "EPMA-1200", WDX type). In this analysis, the filament voltage was set to 15 kV, and the filament current was set to 10 nA. The measurement values obtained in the elemental analysis were converted into the composition ratios of the clathrate compounds. The determined composition ratios are shown in Table 1.

TABLE 1

| Composition ratio (—) | Ba | Ga | Ge | Si |
|---|---|---|---|---|
| Upper layer | 8 | 16.27 | 19.10 | 9.15 |
| Junction | 8 | 16.65 | 25.05 | 3.26 |
| Lower layer | 8 | 16.78 | 28.26 | 0.00 |

As seen from Table 1, the upper layer had a higher Si concentration than the lower layer. The junction showed a Si concentration intermediate between those of the upper and lower layers.

Figure 5:
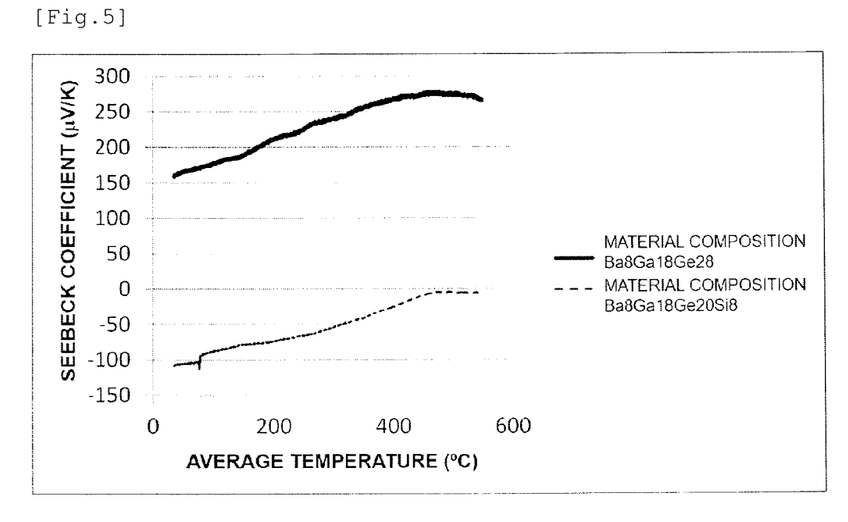
FIG. 5 is a chart showing dependence of Seebeck coefficient on temperature of a semiconductor crystal according to an example of the present invention.

Next, the obtained semiconductor polycrystal was cut at the junction to give two samples made of clathrate compounds with different compositions. For the two samples, the Seebeck coefficient was measured. Specifically, wires were connected to the two opposite end portions in the longitudinal direction of each sample, and the potential difference between the opposite end portions was measured while the sample was heated with maintaining the temperature difference between the opposite end portions at 20° C. The measured potential difference was divided by the temperature difference to calculate the Seebeck coefficient S ($\mu$V/K) for various temperatures. The temperature dependence of the Seebeck coefficient was examined based on the calculated values of the Seebeck coefficient. For each sample, the change in Seebeck coefficient S until the average of the temperatures of the high-temperature and low-temperature sides reached 500° C. is shown in FIG. 5. The Seebeck coefficient S of the sample generally having the composition $Ba_8Ga_{18}Ge_{28}$ was positive, while the Seebeck coefficient S of the sample generally having the composition $Ba_8Ga_{18}Ge_{20}Si_8$ was negative. That is, the former sample was a p-type semiconductor, and the latter sample was an n-type semiconductor.

Example 2

Commercially-available Ba, Ga, Ge, and Si powders (all of which are high-purity products) were prepared. These powders were weighed to give a ratio Ba:Ga:Ge:Si of 8:18:23:5 (molar ratio). The weighed powders were melted by arc melting in the same manner as in Example 1, and the obtained molten liquid was cooled. In this manner, an ingot of a clathrate compound ($Ba_8Ga_{18}Ge_{23}Si_5$) was obtained. Likewise, powders as raw materials were weighed to give a ratio Ba:Ga:Ge of 8:18:28 (molar ratio), and then an ingot of a clathrate compound ($Ba_8Ga_{18}Ge_{28}$) was obtained in the same manner as above.

By using the obtained two clathrate compounds, a semiconductor with the two clathrate compounds joined together was obtained by spark plasma sintering in the same manner as in Example 1. Next, the obtained semiconductor was annealed in the same manner as in Example 1. A semiconductor polycrystal was thus obtained.

Figure 6:
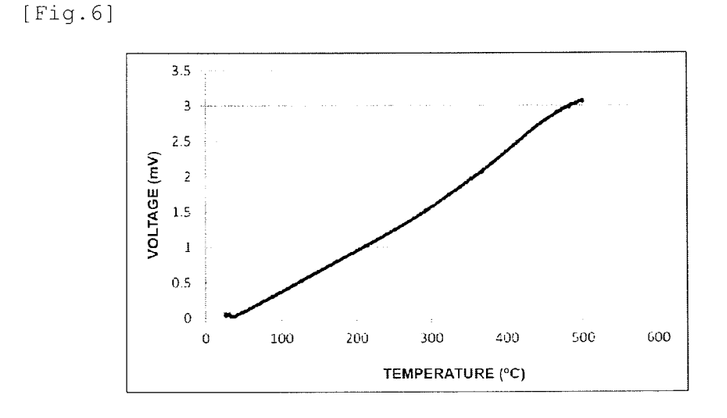
FIG. 6 is a chart showing dependence of voltage on temperature of a semiconductor crystal according to an example of the present invention.

For the semiconductor polycrystal, temperature dependence of voltage was measured in the same manner as in Example 1. The measurement result is shown in FIG. 6. As seen from FIG. 6, it was observed that by heating to a temperature equal to or higher than a given temperature, a potential difference occurred between the opposite end portions of the semiconductor polycrystal despite no temperature difference between the opposite end portions.

Elemental analysis was also conducted in the same manner as in Example 1, and the measurement values were converted into the composition ratios of the clathrate compounds. The determined composition ratios are shown in Table 2.

TABLE 2

| Composition ratio (—) | Ba | Ga | Ge | Si |
|---|---|---|---|---|
| Upper layer | 8 | 15.31 | 22.32 | 5.69 |
| Junction | 8 | 15.38 | 22.79 | 5.00 |
| Lower layer | 8 | 15.27 | 27.91 | 0.02 |

As seen from Table 2, the upper layer had a higher Si concentration than the lower layer. The junction showed a Si concentration intermediate between those of the upper and lower layers.

Example 3

Commercially-available Ba, Ga, Ge, and Si powders (all of which are high-purity products) were prepared. These powders were weighed to give a ratio Ba:Ga:Ge:Si of 8:18:17:11 (molar ratio). The weighed powders were melted by arc melting in the same manner as in Example 1, and the obtained molten liquid was cooled. In this manner, an ingot of a clathrate compound ($Ba_8Ga_{18}Ge_{17}Si_{11}$) was obtained. Likewise, the powders as raw materials were weighed to give a ratio Ba:Ga:Ge of 8:18:28 (molar ratio), and then an ingot of a clathrate compound ($Ba_8Ga_{18}Ge_{28}$) was obtained in the same manner as above.

Figure 7:
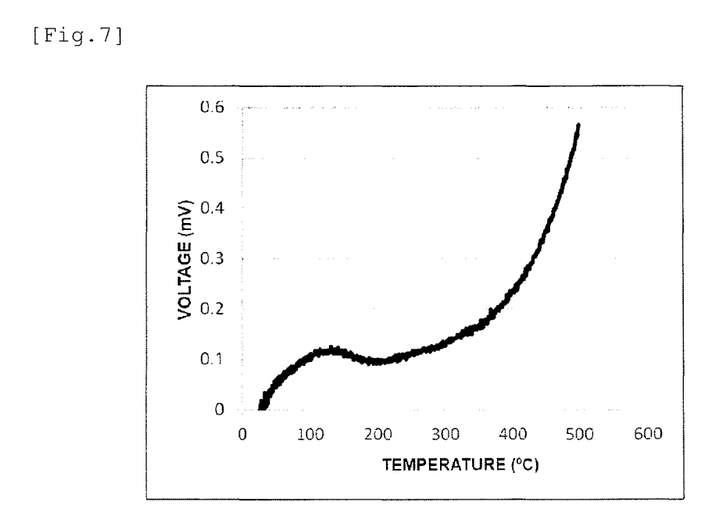
FIG. 7 is a chart showing dependence of voltage on temperature of a semiconductor crystal according to an example of the present invention.

Using the obtained two clathrate compounds, a semiconductor with the two clathrate compounds joined together was obtained by spark plasma sintering in the same manner as in Example 1. Next, the obtained semiconductor was annealed in the same manner as in Example 1. A semiconductor polycrystal was thus obtained. For the semiconductor polycrystal, temperature dependence of voltage was measured in the same manner as in Example 1. The measurement result is shown in FIG. 7. As seen from FIG. 7, it was observed that by heating to a temperature equal to or higher than a given temperature, a potential difference occurred between the opposite end portions of the semiconductor polycrystal despite no temperature difference between the opposite end portions.

Elemental analysis was also conducted in the same manner as in Example 1, and the measurement values were converted into the composition ratios of the clathrate compounds. The determined composition ratios are shown in Table 3.

TABLE 3

| Composition ratio (—) | Ba | Ga | Ge | Si |
|---|---|---|---|---|
| Upper layer | 8 | 15.40 | 16.68 | 12.08 |
| Junction | 8 | 15.32 | 19.17 | 8.65 |
| Lower layer | 8 | 15.79 | 27.56 | 0.00 |

As seen from Table 3, the upper layer had a higher Si concentration than the lower layer. The junction showed a Si concentration intermediate between those of the upper and lower layers.

The present application is based on the Japanese Patent Application filed on Jan. 19, 2017 (Japanese Patent Application No. 2017-007728), the contents of which are incorporated herein by reference.

INDUSTRIAL APPLICABILITY

According to the present invention, a thermoelectric element capable of generating electrical power by heating without temperature difference can be provided even by the use of clathrate compounds with a wide variety of compositions. Thus, the semiconductor crystal in the present invention is industrially applicable, particularly in fields where thermoelectric elements are used.

REFERENCE SIGNS LIST 10, 20, 30: Semiconductor crystal
12, 12a, 12b: n-type semiconductor portion
14, 14a, 14b: p-type semiconductor portion
16: p-n junction
18: Intrinsic semiconductor portion

The invention claimed is:

1. A semiconductor crystal comprising a clathrate compound represented by the following formula (I), the semiconductor crystal having one end portion and the other end portion, wherein the one and the other end portions differ in concentration of at least one element in the formula (I):

$$A_x D_y E_{46-y} \quad (I)$$

wherein A represents at least one element selected from the group consisting of Ba, Na, Sr, and K, D represents at least one element selected from the group consisting of B, Ga, and In, E represents at least one element selected from the group consisting of Si, Ge, and Sn, x is 7 or more and 8 or less, and y is 14 or more and 20 or less.

2. The semiconductor crystal according to claim 1, wherein the one end portion is a p-type semiconductor portion, the other end portion is an n-type semiconductor portion, and the p-type semiconductor portion and the n-type semiconductor portion are joined to each other.

3. The semiconductor crystal according to claim 1, wherein the clathrate compound comprises a compound represented by the following formula (II):

$$A_x D_y E^1_{46-y-z} Si_z \quad (II)$$

wherein A represents at least one element selected from the group consisting of Ba, Na, Sr, and K, D represents at least one element selected from the group consisting of B, Ga, and In, $E^1$ represents at least one element selected from the group consisting of Ge and Sn, x is 7 or more and 8 or less, y is 14 or more and 20 or less, and z is 0 or more and 23 or less.

4. The semiconductor crystal according to claim 1, wherein the one end portion is a p-type semiconductor portion comprising a clathrate compound represented by the following formula (III), and the other end portion is an n-type semiconductor portion comprising a clathrate compound represented by the following formula (IV):

$$A_x D_y E^2_{46-y-z1} Si_{z1} \quad (III)$$

wherein A represents at least one element selected from the group consisting of Ba, Na, Sr, and K, D represents at least one element selected from the group consisting of B, Ga, and In, $E^2$ represents at least one element selected from the group consisting of Ge and Sn, x is 7 or more and 8 or less, y is 14 or more and 20 or less, and z1 is 0 or more and less than 4, $$A_x D_y E^1_{46-y-z2} Si_{z2} \quad (IV)$$

wherein A represents at least one element selected from the group consisting of Ba, Na, Sr, and K, D represents at least one element selected from the group consisting of B, Ga, and In, $E^1$ represents at least one element selected from the group consisting of Ge and Sn, x is 7 or more and 8 or less, y is 14 or more and 20 or less, and z2 is 3 or more and 23 or less, provided that z2 is greater than z1 in the formula (III).

5. The semiconductor crystal according to claim 1, wherein a difference between the number y in the one end portion and the number y in the other end portion is 0.01 or more and 4.0 or less.

6. The semiconductor crystal according to claim 1, wherein A is Ba in the formula (I).

7. The semiconductor crystal according to claim 1, wherein D is Ga in the formula (I).

8. The semiconductor crystal according to claim 1, wherein E is at least one element selected from the group consisting of Ge and Si in the formula (I).

9. The semiconductor crystal according to claim 1, wherein the semiconductor crystal is a single crystal or a polycrystal.

10. The semiconductor crystal according to claim 1, comprising a clathrate compound represented by the following formula (V):

$$Ba_x D_y Ge_{46-y-z} Si_z \quad (V)$$

wherein D represents at least one element selected from the group consisting of B, Ga, and In, x is 7 or more and 8 or less, y is 14 or more and 20 or less, and z is 0 or more and 23 or less.

11. The semiconductor crystal according to claim 1, comprising a clathrate compound represented by the following formula (VI):

$$Ba_x Ga_y Ge_{46-y-z} Si_z \quad (VI)$$

wherein x is 7 or more and 8 or less, y is 14 or more and 20 or less, and z is 0 or more and 23 or less.

12. A power generation method generating electrical power by heating the semiconductor crystal according to claim 1.

13. An infrared detector comprising the semiconductor crystal according to claim 1.

14. The semiconductor crystal according to claim 2, wherein the clathrate compound comprises a compound represented by the following formula (II):

$$A_x D_y E^1_{46-y-z} Si_z \quad (II)$$

wherein A represents at least one element selected from the group consisting of Ba, Na, Sr, and K, D represents at least one element selected from the group consisting of B, Ga, and In, $E^1$ represents at least one element selected from the group consisting of Ge and Sn, x is 7 or more and 8 or less, y is 14 or more and 20 or less, and z is 0 or more and 23 or less.

15. The semiconductor crystal according to claim 2, wherein a difference between the number y in the one end portion and the number y in the other end portion is 0.01 or more and 4.0 or less.

16. The semiconductor crystal according to claim 3, wherein a difference between the number y in the one end portion and the number y in the other end portion is 0.01 or more and 4.0 or less.

17. The semiconductor crystal according to claim 4, wherein a difference between the number y in the one end portion and the number y in the other end portion is 0.01 or more and 4.0 or less.

18. The semiconductor crystal according to claim 2, wherein A is Ba in the formula (I).

19. The semiconductor crystal according to claim 3, wherein A is Ba in the formula (I).

20. The semiconductor crystal according to claim 4, wherein A is Ba in the formula (I).

\* \* \* \* \*

UNITED STATES PATENT AND TRADEMARK OFFICE
CERTIFICATE OF CORRECTION

PATENT NO. : 10,811,584 B2
APPLICATION NO. : 16/478752
DATED : October 20, 2020
INVENTOR(S) : Sueoka et al.

It is certified that error appears in the above-identified patent and that said Letters Patent is hereby corrected as shown below:

On the Title Page

Page 2/U.S. Patent Documents (Column 1, Line 1), please change "2/2001" to -- 2/2011 --.
Page 2/Foreign Patent Documents (Line 4), please change "JP 2015/039161 3/2018" to -- WO 2015/039161 3/2015 --.

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*